United States Patent [19]

Brunner et al.

[11] 4,039,371

[45] Aug. 2, 1977

[54] ETCHANT FOR POLYIMIDES

[75] Inventors: Friedrich Brunner, Sindelfingen; Peter Frasch, Boeblingen; Friedrich Schwerdt, Burgwedel, all of Germany

[73] Assignee: International Business Machines Corporation, Armonk, N.Y.

[21] Appl. No.: 718,709

[22] Filed: Aug. 30, 1976

[30] Foreign Application Priority Data

Sept. 18, 1975  Germany .............................. 2541624

[51] Int. Cl.² .............................................. B29C 17/08
[52] U.S. Cl. ..................................... 156/668; 156/655; 252/79.5
[58] Field of Search .................... 156/3, 630, 655, 668; 427/307, 308; 252/79.5, 148, 156, 54, 79.4, 8.8; 134/38, 39, 4; 260/501.15, 567.6 R

[56] References Cited

U.S. PATENT DOCUMENTS

| | | | |
|---|---|---|---|
| 2,374,213 | 4/1945 | Katzman | 252/547 |
| 3,702,285 | 11/1972 | Knorre et al. | 156/668 |
| 3,770,528 | 11/1973 | Hermes | 156/668 |
| 3,773,463 | 11/1973 | Cohen et al. | 252/8.8 AJ |
| 3,775,316 | 11/1973 | Berg et al. | 252/8.8 |
| 3,871,730 | 3/1975 | Fish | 252/79.5 |
| 3,958,059 | 5/1976 | Diehl | 252/547 |

*Primary Examiner*—Charles E. Van Horn
*Assistant Examiner*—Jerome W. Massie
*Attorney, Agent, or Firm*—Henry Powers

[57] ABSTRACT

A composition for etching polyimide based polymers comprised of a tetraalkyl ammonium hydroxide and an organic acid selected from the group of acetic acid, tartaric acid and oxalic acid.

The etchant may be used to texture polyimide films or form perforations through polyimide substrates or layers, particularly in the fabrication of printed circuits and semiconductor devices where via holes are required for interconnection of circuitry.

3 Claims, 1 Drawing Figure

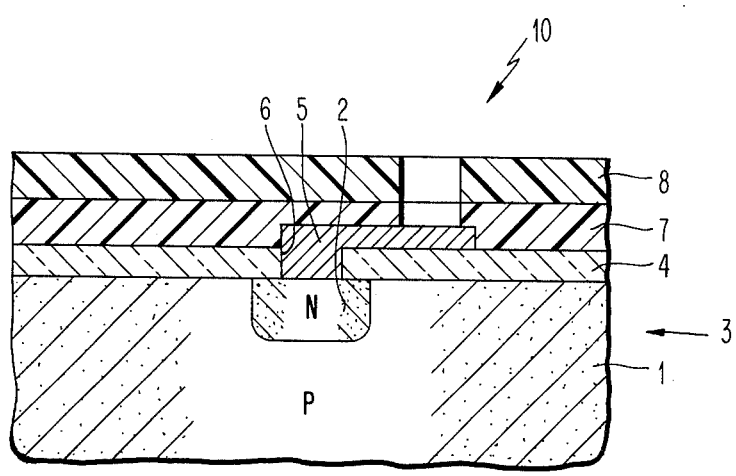

ETCHANT FOR POLYIMIDES

FIELD OF THE INVENTION

This invention relates to etchant compositions, and more particularly to etchants for polyimide based polymers.

DESCRIPTION OF THE PRIOR ART

As discussed in U.S. Pat. No. 3,700,497, the properties of polyimides makes them attractive for use in the fabrication of semiconductor devices or integrated circuits. The polyimides are condensation products of pyromellitic dianhydride and an aromatic diamine, and are characterized with attractive high temperature and dielectric properties. The electrical properties include high resistivity, high dielectric strength (eg. high breakdown resistance) and low loss factors. These properties are relatively temperature independent, with excellent mechanical characteristics, at temperatures up to 500° to 600° C. In addition, the polyimides are characterized with a high degree of inertness to most chemicals.

These indicated properties of polymides make them attractive for use, as indicated in the aforesaid patent, U.S. Pat. No. 3,700,497, for passivation of semiconductor devices, encapsulation thereof against contaminants in the ambient, and as masks for deposition of metallization in an interconnecting pattern between devices of an integrated circuit.

In the manufacture of semiconductor devices, circuit elements are formed in a substrate, such as monocrystalline silicon, by diffusion of an appropriate impurity through openings of a diffusion mask which nitride layer on the substrate. Connections are made to the circuit elements by depositing a conductive film, such as aluminum, over the dielectric layer and in ohmic contact with the circuit elements. The conductive film is then delineated into an interconnecting pattern between circuit element by use of photolithographic techniques well known in the art as discussed in the aforesaid U.S. Pat. No. 3,700,497. The device (inclusive of the conductor pattern) may then be encapsulated by a coating of a polyimide based polymer through which openings may be formed, normally by etching, for external electrical access to the conductive pattern.

Generally, the polyimide layer is deposited in a partially cured condition, and after openings are formed therethrough, the polymer is cured followed by deposition of a suitable conductive metal in the openings to form terminals for external connection in the circuit in which the device is to be used.

Various etchants for the polyimide heretofore proposed include the use of hydrazine along in an aqueous concentrated solution. Although hydrazine has been shown to be an effective etchant, it however has the disadvantage of being a health hazard in the effective amounts have been found, in the absence of extreme care, to attack skin and eyes.

Other etchants proposed for use with polyimides but failing to find acceptance in the art, include the use, as disclosed in German Offenlegungsschrift No. 2,457,377, of quatenary ammonium hydroxide in concentrations of at least about 30 vol. % in non-aqueous solvents such as dimethyl sulfoxide, sulfolane, dimethyl formamide, and the like.

Further etchants are disclosed in U.S. Pat. No. 3,361,589 which include the use of strong basic solutions of alkali metal hydroxides, quatenary ammonium hydroxides, and the like. Most of these etchants, depending on their concentration, have the disadvantage of only slowly attacking the polyimide films taking inordinate times to show any significant effect on the films. However, the polyalkyl ammonium hydroxides, particularly the tetraalkyl ammonium hydroxides, are of particular interest for the etching of polyimides in view of their effectiveness in a very narrow range of concentration, i.e. with two or three precent b.w. solutions. In this range of concentration, they are characterized with high etching rates resulting in undesirably high etching angles which extend from vertical etch angles or etch angles higher than 90° in contact opening to the underlying semiconductor substrate. As is known, high vertical angles are undesirable since deposited metallization will have a tendency to break continuity at such sharp angles, with concurrent discontinuity in electrical conduction.

Another etchant providing longer etch times for use with polymers are the basic developers such as the Shipley AZ developer containing socium metasilicate and sodium phosphates normally used to develop positive diazo sensitized phenol-formaldehyde based resists such as the commercially available AZ-1350J of the Shipley Company. Although such developers provide etch angles of 40° to 55° in the polyimides, they are characterized with the tendency of high absorption of sodium ions in the polyimides, particularly at the edges of the contact opening. In view of the high mobility of sodium ions, they can readily migrate to the underlying semiconductor substrate resulting in instability and electrical defects in the devices. Also, such developers are not amenable to their use in spray devices due to the tendency of their salt content to crystallize at the spray nozzles.

SUMMARY OF THE INVENTION

In view of the foregoing, it is an object of this invention to provide a novel etchant composition for polyimide based polymers.

It is another object of this invention to provide a novel etchant composition to form contact openings in polyamidocarboxylic acid polymer films with etch angles less then 90° and preferably less than 60°.

It is a further object of this invention to provide a novel etchant composition which is compatibly useful in etching polyamidocarboxylic acid polymers and exposed positive diazo sensitized phenol-formaldehyde based resists.

The foregoing objects of this invention can be attained by an etching composition for polyimide based polymers which in its broad context, comprehends the use of tetraalkyl ammonium hydroxides (wherein the alkyl groups contain from 1 to 4 carbon atoms) in combination with a weak organic acid selected from the group consisting of acetic acid, tartaric acid and oxalic acid. A typical etchant in accordance with the foregoing comprises tetramethyl ammonium hydroxide and acetic acid. Effectively, the etchant can contain from 2.2 to about 3.0 weight percent of the tetraalkyl ammonium hydroxide and from about 1.1 to about 1.5 weight percent of the weak organic acid.

This etchant can be employed not only for chemically milling openings through a polyimide based polymer film, but also for texturizing the surface thereof to facilitate bonding thereof in fabrication of laminates.

The foregoing and other objects, features and advantages of the invention will be apparent from the following more particular description of preferred embodiments of the invention as illustrated in the accompanying drawings.

BRIEF DESCRIPTION OF THE DRAWING

FIG. 1 is a fragmentary view in elevation of a semiconductor device for purposes of illustrating this invention.

DESCRIPTION OF THE PREFERRED EMBODIMENTS

The invention, for convenience, is described in reference to its use in the fabrication of semiconductor devices, with it to be understood that the novel etchant composition of this invention may be employed in other applications, including the fabrication of printed circuits, forming openings in polyimide based films and embossing thereof.

Referring to the drawing, shown therein is a fragmentary portion of a semiconductor device, which illustratively may be a segment of a field effect transistor 3 comprised of a P-type monocrystalline semiconductor substrate 1, typically silicon, having diffused therein an N-type region 2 which could be representative of a source or drain region of the transistor 3.

In accordance with conventional practice, the circuit components of the device and substantially all of the top active surfaces of the substrate are covered with a passivating dielectric layer 4 which conveniently can be about a 5,000 A layer of silicon dioxide film genetically grown from the silicon substrate or deposited thereon by any conventional means. As will be understood, although silicon dioxide has been indicated for passivation layer, other dielectric materials can also be used such as silicon nitride, or a composite of silicon dioxide and silicon nitride with the oxide disposed adjacent the semiconductor substrate.

As shown, the device will include an interconnecting conductor pattern such as shown at 5, which can be comprised of aluminum deposited by any conventional manner, such as evaporation, which overlies a portion of the dielectric layer 4, and extends therethrough, via access opening 6 to connect with circuit element or diffused region 2.

Although not required, the structure may be immersed in a solution of γ-aminopropyltriethoxysilane in trichlorotrifluoroethane to condition the active surface of device 3 for adhesion of a thin film of polyamidocarboxylic acid resin. This resin is thermoplastic polymer and illustratively can be formed from the reaction of a tetracarboxylic acid dianhydride, such as pyromellitic acid, and a diamine such as 4,4'-diaminodiphenyl ether. The above noted pyromellitic acid based polymer has been assigned the following structural formula:

the dielectric layer 4 and metallization 5) by means of spinning thereon from a suitable solution, as for example in a solvent comprised of a N-methyl pyrrolidone-xylene mixture.

Although the amount of the polymer can vary to some extent, effective solutions can be obtained which contain from about 12 to about 18 weight percent of the uncured resin, which can be employed by spin-coating techniques employed for coating of photoresists in the semiconductor industry, or by spray techniques. The applied resin layer can effectively have a wet layer thickness in the range of about 20,000 to about 80,000 A with the layer thickness depending on the concentration of the resin in the solution, and on the rotational speed of the spinner. After application of the resin, it is precured at for about 30 minutes at 130° C in an inert atmosphere, such as nitrogen, to drive off the solvent.

In the next operation, a thin photoresist layer 8 is applied over the precured polyimide film 7. The photoresist can comprise any of the conventional positive resists commercially available in the market. Illustrative of a positive resist is commercial resist marketed by the Shipley Company under the designation AZ-1350J, which is comprised of a phenol-formaldehyde resin and a diazonaphthoquinone sensitizer. This resist is also applied by spin-coating techniques, with a typical thickness of about 15,000 A. After application, the resist can be dried for 15 minutes at 85° C in an inert atmosphere, such as nitrogen.

The photoresist is then exposed to ultraviolet light through a mask in a pattern corresponding to the openings desired, at 10 in the drawing, followed by removal of the exposed portions of the positive resist layer 8, and the underlying portions of the precured polyimide coating 7, in a two-stage development process.

Bath 1 comprised an aqueous tetraalkylammonium hydroxide solution, as for example a 0.237 molar tetramethyl ammonium hydroxide solution at a pH value of about 13.4. The device is immersed in the solution for sufficient time to removed the exposed portion of photoresist layer 8 (eg. 60 seconds for a 15,000 A thick resist layer).

In the next step, the bared portions of the precured polyimide layer 7 are removed by treatment with an aqueous solution containing about 2.2 to about 3 weight percent of tetraalkylammonium hydroxide (eg. tetramethyl ammonium hydroxide) buffered with a weak organic acid selected from the group consisting of acetic acid, tartaric acid and oxalic acid. Of these acids, meso-tartaric acid has a dissociation constant Kc of 6.0 $\times 10^{-4}$, oxalic acid a Kc of 5.9 $\times 10^{-2}$ (first step), and acetic acid a Kc of 1.76 $\times 10^{-5}$. Acetic acid has been determined as preferable for buffering of tetramethyl ammonium hydrosice. Bath 2 is prepared by slowly

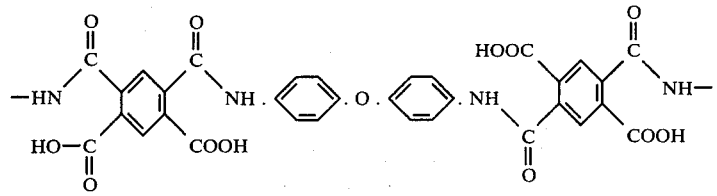

Polyamidocarboxylic acid resins of the above type are available from the DuPont Company under the designation Pyre M.L.R.C. 5057.

This uncured polyamidocarboxylic acid is then applied as a thin layer 7 over the active surface (eg. over neutralizing a solution of the indicated tetramethyl ammonium hydroxide with the weak organic acid to a pH value of about 12.6 found operative for etching of the precured polyimide. No advantage was seen in operating outside of the 2.2 to 3 weight percent concentration of the tetraalkyl ammonium hydroxide (and outside of the 1.1 to 1.5 weight percent concentration of the weak organic acid). For example, greater concentrations of the tetramethyl ammonium acetate were not seen to improve etch angles, and weaker concentrations were not seen to have any influence on the etch angle.

These buffered solutions were found to reduce th etching speeds to controllable rates (as compared to unbuffered tetraalkyl ammonium hydroxide solutions) to enable the obtainment of satisfactory etch angles of less than 90°, as for example preferred angles of 45° to 55°. These longer etch times also permit a more precise determination of the completion of the etching process for the uncured polyimide film. Illustratively, the uncured polyimide films of about 60,000 A layer thickness can be etched in 120 seconds in the buffered solutions.

After etching, the devices rinsed, dried, and the precured polyimide cured at temperatures of the order of 660° F for about 10 minutes.

The cured polyimides have the following structure assigned to them:

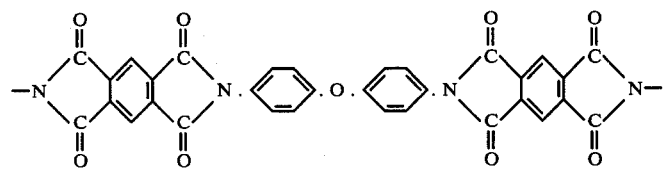

It is believed that the following experiments will illustrate the advantages of the invention.

A series of monocrystalline silicon wafers were thermally oxidized to form about a 5,000 A thick film of silicon oxide whose outer surface was conditioned by immersion in a 0.1 weight percent solution of γ-aminopropyltriethoxysilane [eg. $NH_2 — (CH_2)_3 — Si — (OC_2H_5)_3$], in trichlorotrifluoroethane (eg. $CCl_3CF_3$). The wafers were removed from the solution after about 30 seconds, and dried. The treated oxide surface was then coated by spinning with a layer of a polyamidocarboxylic acid product formed from the reaction of pyromellitic acid anhydride and 4,4'-diaminodiphenyl in a binary solvent of N-methyl pyrrolidon and xylene. The wet thickness of the polyamidoxcarboxylic acid coating was about 80,000 A.

After precuring of the resin at 130°C for 30 minutes in a nitrogen atmosphere, it was then coated by spinning with AZ-1350J positive photoresist (available from the Shipley Company, Newton, Mass.) which comprises a photosensitive phenol-formaldehyde resin and diazonaphthoquinone sensitizer (eg. 3,4-dihydroxy-benzophenone-4-[naphthoquinone (1.29 diazide (2)] - sulfonate. The layer thickness of the photoresist was 15,000 A. The photoresist layer was then dried for 15 minutes at 85° C in a nitrogen atmosphere. The photoresist was then exposed to a 200 W high pressure mercury lamp to define 29-31 micron sized openings in the resist. As is known, there is decomposition of the diazonaphthoquinone sensitizer in the exposed areas which renders the resist soluble in an alkaline developer.

Individual portions of these wafers were then immersed in the following developing solutions for removal of the exposed portions of the photoresist layer and the underlying portions of the precured resin.

Developer A. The AZ developer of Shipley Company diluted with water in a 1:1 volume ratio. This developer is an aqueous alkaline solution containing sodium metasilicate, sodium phosphate and sodium hydrogen phosphate.

Developer G. Comprised of a 2.5 weight percent aqueous solution of tetramethylammonium hydroxide.

Developer C. This is a two-bath developer system wherein,

Bath 1 is a aqueous solution containing 0.237 molar tetramethyl ammonium hydroxide with a pH of 13.4. This bath was prepared by diluting 500ml of 10 weight percent aqueous solution of tetramethylammonium hydroxide with 1500mls. distilled water; and Bath 2 is a buffered tetramethylammonium hydroxide solution with a pH of 12.6 This bath is prepared by diluting 500mls. of a 10 weight percent aqueous tetramethylammonium hydroxide solution with 1500mls. of distilled water, then neutralizing the mixture of a pH of 7 with glacial acetic acid (eg. 31ml). A 10 weight percent aqueous solution of tetramethylammonium hydroxide was added drop-by-drop (96ml) and with stirring until a pH of 12.6 was obtained.

The results are summarized in the following table:

TABLE 1

| Developer | | pH | Etch Time (Seconds) | Etch Angle |
|---|---|---|---|---|
| A | | 12.68 | 90 | 45–55° |
| B | | 13.41 | 50 | 80–90° |
| C | Bath 1 | 13.4 | 60 | |
| | Bath 2 | 12.6 | 120 | 45–55° |

The above Table sets forth the pH values of the developers (eg. etch solutions), immersion times, and etch angles obtained by etching as determined under a scanning electron microscope adapted for this purpose.

With respect to Developer C above, the wafers were first immersed in Bath 1 for 60 seconds, and with the pH value of 13.4 the light exposed parts of the photoresist layer were removed in the specified time.

The wafers were immersed for 120 seconds in Bath 2 which consists of an acetate buffered tetramethylammonium hydroxide solution, where the 29-31 micron openings were etched through the polyamidocarboxylic acid layer in the portions where the photoresist layer was removed in Bath 1. The controlled composition of Bath 2 reduced the etching rate of the resin to a sufficient level so that the etching process could be controlled to provide 45° to 55° etch angles in the polyamidocarboxylic acid film. In addition, these longer developing and etching times enable a more precise determination of the end points of development or etching.

While the 1:1 diluted AZ developer system also provided etch angles of 45° to 55°, however, in use, this system is characterized by the absorption of sodium ions at the edges of the openings, which due to their high mobility can subsequently lead to electrical defects where an integrated circuit is contained in the semiconductor wafers. The metal ion-free etchant of this invention avoids these problems.

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. A process of etching a polyimide based polymer comprising contacting said polymer with an aqueous solution of a polyalkylammonium hydroxide and an organic acid selected from the group consisting of acetic acid, tartaric acid and oxalic acid.

2. The process of claim 1 wherein said solution comprises tetramethylammonium hydroxide and acetic acid.

3. The process of claim 2 wherein said solution comprises about 2.2 to about 3.0 weight percent of said tetramethylammonium hydroxide and about 1.1 to about 1.5 weight percent of said acetic acid.

* * * * *